United States Patent
Horiuchi et al.

(10) Patent No.: US 11,952,316 B2
(45) Date of Patent: Apr. 9, 2024

(54) COMPOSITE GREEN SHEET AND CERAMIC MEMBER

(71) Applicant: SHINKO ELECTRIC INDUSTRIES CO., LTD., Nagano (JP)

(72) Inventors: Michio Horiuchi, Nagano (JP); Tomotake Minemura, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/744,467

(22) Filed: Jan. 16, 2020

(65) Prior Publication Data
US 2020/0247721 A1 Aug. 6, 2020

(30) Foreign Application Priority Data

Feb. 5, 2019 (JP) ................................. 2019-019124

(51) Int. Cl.
| | | |
|---|---|---|
| *B32B 15/04* | (2006.01) | |
| *B32B 15/20* | (2006.01) | |
| *C04B 37/02* | (2006.01) | |
| *H01F 27/28* | (2006.01) | |
| *H01L 21/683* | (2006.01) | |

(52) U.S. Cl.
CPC ............ *C04B 37/021* (2013.01); *B32B 15/04* (2013.01); *B32B 15/20* (2013.01); *H01F 27/2804* (2013.01); *H01L 21/6833* (2013.01); *C04B 2237/343* (2013.01); *C04B 2237/402* (2013.01); *C04B 2237/407* (2013.01); *C04B 2237/62* (2013.01); *H01F 2027/2819* (2013.01)

(58) Field of Classification Search
None
See application file for complete search history.

(56) References Cited

U.S. PATENT DOCUMENTS

| | | | | |
|---|---|---|---|---|
| 5,230,138 | A | * | 7/1993 | Shiga .................. C04B 35/6455 419/3 |
| 6,329,065 | B1 | | 12/2001 | Ishida et al. |
| 2002/0106577 | A1 | | 8/2002 | Kubota |
| 2005/0030696 | A1 | | 2/2005 | Ouchi et al. |
| 2005/0184055 | A1 | * | 8/2005 | Natsuhara .............. H05B 3/143 219/548 |
| 2006/0157472 | A1 | * | 7/2006 | Mashima ................. H05B 3/68 219/444.1 |

(Continued)

FOREIGN PATENT DOCUMENTS

| | | |
|---|---|---|
| CN | 1505073 | 6/2004 |
| JP | H07-211509 | 8/1995 |
| JP | 2000-188453 | 7/2000 |

(Continued)

OTHER PUBLICATIONS

Bib Data and translation; JP 2002373862—AMorita, Naotoshi; Dec. 2002 (Year: 2002).*

(Continued)

*Primary Examiner* — Humera N. Sheikh
*Assistant Examiner* — Elizabeth D Ivey
(74) *Attorney, Agent, or Firm* — IPUSA, PLLC

(57) ABSTRACT

A composite green sheet includes a green sheet, and a bulk metal film provided on the green sheet. Examples of the metal forming the metal film may include aluminum, aluminum alloys, copper, copper alloy, or the like.

19 Claims, 13 Drawing Sheets

(56) References Cited

U.S. PATENT DOCUMENTS

2006/0213900 A1* 9/2006 Matsuda ............. H01L 21/6833
219/444.1
2009/0117290 A1 5/2009 Kim et al.

FOREIGN PATENT DOCUMENTS

| JP | 2002-043481 | | | 2/2002 |
|----|-------------|---|---|--------|
| JP | 2002-169273 | | | 6/2002 |
| JP | 2002-373862 | | | 12/2002 |
| JP | 2002373862 | A | * | 12/2002 |
| JP | 2003-249755 | | | 9/2003 |
| JP | 2006-130724 | | | 5/2006 |
| JP | 2006-269826 | | | 10/2006 |
| JP | 2007-227477 | | | 9/2007 |
| JP | 2007-294795 | | | 11/2007 |
| JP | 2008-047604 | | | 2/2008 |
| JP | 2008-186905 | | | 8/2008 |
| JP | 2008186905 | A | * | 8/2008 |
| JP | 2009-203097 | | | 9/2009 |
| JP | 2016-141572 | | | 8/2016 |
| KR | 10-2007-0059484 | | | 6/2007 |
| KR | 10-2009-0002576 | | | 1/2009 |
| TW | 200711028 | | | 3/2007 |
| WO | 91/001954 | | | 2/1991 |

OTHER PUBLICATIONS

Translation—JP-2008186905-A; Kawai S; Aug. 2008 (Year: 2008).*
Office Action dated Jun. 15, 2022 issued with respect to the corresponding Chinese Patent Application No. 202010062095.5 with full machine translation.
Office Action dated Oct. 25, 2022 with respect to the corresponding Japanese patent application No. 2019-019124.
Office Action dated Apr. 4, 2023 with respect to the corresponding Japanese patent application No. 2019-019124.
R. N. Master et al., "Cofiring Process for Glass-Ceramic/Copper Multilayer Ceramic Substrate", Proc. 41st Electronic Components and Technology Conference, pp. 5-9, (1991).
Office Action dated Jul. 4, 2023 with respect to the corresponding Japanese patent application No. 2019-019124.
Office Action dated Jun. 9, 2023 with respect to the corresponding Taiwanese patent application No. 109101916.

* cited by examiner

COMPOSITE GREEN SHEET AND CERAMIC MEMBER

CROSS-REFERENCE TO RELATED APPLICATION

This application is based upon and claims priority to Japanese Patent Application No. 2019-019124, filed on Feb. 5, 2019, the entire contents of which are incorporated herein by reference.

FIELD

Certain aspects of the embodiments discussed herein are related to a composite green sheet, a ceramic member, a method of manufacturing the composite green sheet, and a method of manufacturing the ceramic member.

BACKGROUND

A ceramic green sheet may be used when manufacturing a ceramic member, such as an electrostatic chuck, a wiring board, a piezoelectric actuator, or the like. First, when manufacturing the ceramic member, a metal powder having a melting point higher than a firing temperature of the ceramic is made into a paste. Then, the paste is coated on a surface of the green sheet. A plurality of such green sheets are prepared. The plurality of green sheets are then laminated, and the laminated structure is fired within a reducing atmosphere, to form the ceramic member. Such a method of manufacturing the ceramic member is described in Japanese Laid-Open Patent Publications No. 2007-294795, No. 2002-373862, No. 2002-043481, and No. 2000-188453, for example. Other methods are described in Japanese Laid-Open Patent Publications No. 2016-141572, No. 2009-203097, No. 2008-047604, and No. 2007-227477, for example.

However, when the ceramic member is manufactured by the method described above, a thickness of a conductive member that is foiled from a sintered body of the metal powder easily varies.

SUMMARY

Accordingly, it is an object in one aspect of the embodiments to provide a composite green sheet, a ceramic member, a method of manufacturing the composite green sheet, and a method of manufacturing the ceramic member, which can reduce a thickness variation of a conductive member.

According to one aspect of the embodiments, a composite green sheet includes a green sheet, and a bulk metal film provided on the green sheet.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
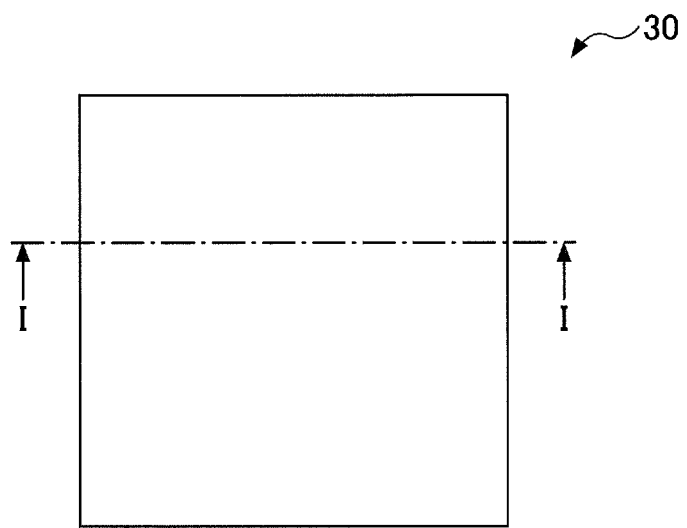
FIG. 1A and FIG. 1B are diagrams illustrating a composite green sheet according to a first embodiment.

Preferred embodiments of the present invention will be described with reference to the accompanying drawings. In the drawings, those parts that are the same are designated by the same reference numerals, and a repeated description of the same parts may be omitted.

A description will now be given of a composite green sheet, a ceramic member, a method of manufacturing the composite green sheet, and a method of manufacturing the ceramic member according to each embodiment of the present invention.

First Embodiment

Figure 1B:
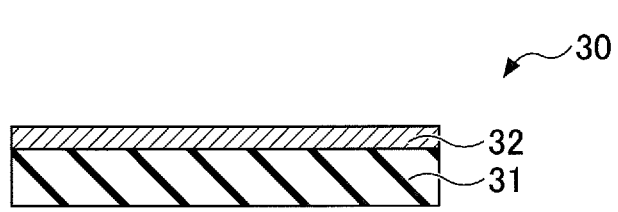

First, a first embodiment will be described. The first embodiment relates to the composite green sheet. FIG. 1A and FIG. 1B are diagrams illustrating the composite green sheet according to the first embodiment. FIG. 1A is a plan view of the composite green sheet, and FIG. 1B is a cross sectional view of the composite green sheet along a line I-I in FIG. 1A.

As illustrated in FIG. 1A and FIG. 1B, a composite green sheet 30 according to the first embodiment includes a green sheet 31, and a bulk metal film 32 provided on the green sheet 31.

Because the composite green sheet 30 includes the bulk metal film 32, the composite green sheet 30 may be used to manufacture a ceramic member, without coating a paste of a metal powder. When using the paste of the metal powder, it is difficult to coat the paste to a uniform thickness. In addition, since an organic component within the paste is eliminated during the firing, a bulk of the conductive member becomes smaller than a bulk of the coated paste. Consequently, the thickness of the conductive member, that is formed by a sintered metal made from the paste of the metal powder, easily varies. On the other hand, the bulk metal film 32 having a small thickness variation can be obtained with ease. For this reason, it is possible to reduce the thickness variation of the conductive member within the ceramic member, by using the composite green sheet 30.

In addition, although the sintered metal includes an inclusion during the firing, the bulk metal film 32 is unlikely to include the inclusion when melting and solidifying. Hence, by using the composite green sheet 30, it is possible to avoid an increase of an electrical resistivity and avoid a reduction of a thermal conductivity, respectively caused by mixing of the inclusion.

Furthermore, the composite green sheet 30 is flexible, and can be cut with ease. Accordingly, the composite green sheet 30 has superior general-purpose properties that enables application thereof to various use.

Figure 2:
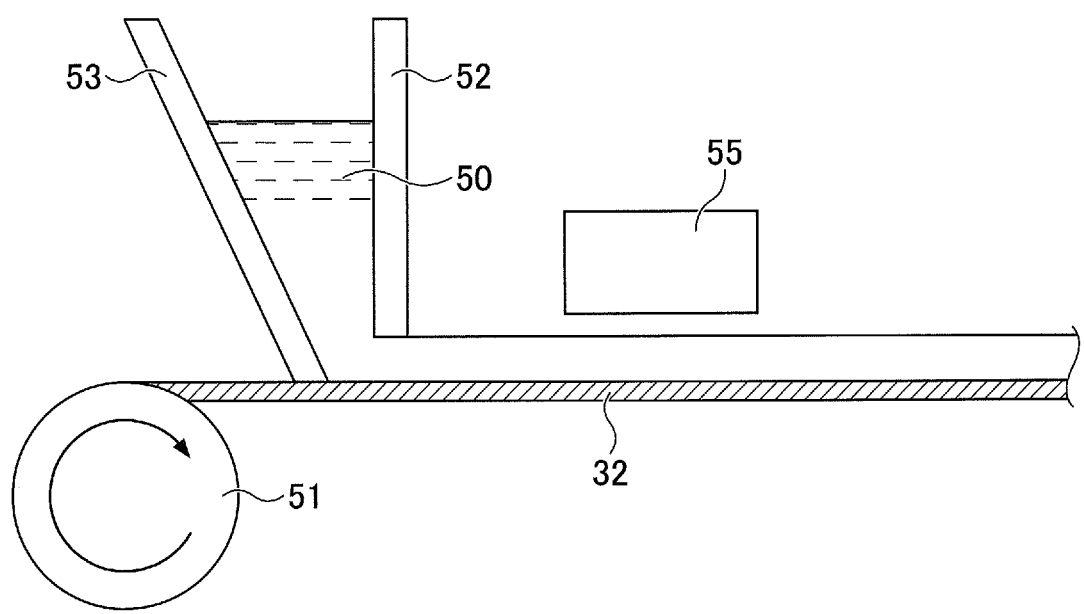
FIG. 2 is a diagram for explaining a method of manufacturing the composite green sheet according to the first embodiment.

The composite green sheet 30 may be manufactured by the doctor blade, for example. A method of manufacturing the composite green sheet 30 by the doctor blade will be described. FIG. 2 is a diagram for explaining the method of manufacturing the composite green sheet 30 according to the first embodiment.

According to this manufacturing method, the metal film 32 is wound on a film roll 51, as a carrier film, and the metal film 32 is passed under a blade 52 at a constant speed while being unwound from the film roll 51. A side plate 53 is provided on a rear of the blade 52 along a traveling direction of the metal film 32, and a slurry 50, that is a raw material for the green sheet 31, is supplied between the blade 52 and the side plate 53. The slurry 50 is coated on the metal film 32, from a gap between the blade 52 and the side plate 53. Thereafter, the slurry 50 that is coated on the metal film 32 is dried by a drier 55. The slurry 50 that is dried becomes the green sheet 31. The green sheet 31 is flexible, and can be wound on a roll located on an ejection end. The slurry 50 may be dried by air-drying or natural drying, for example.

The composite green sheet 30 can be manufactured as described above. The composite green sheet 30 may be cut into various shapes depending on the use thereof.

A composition of the slurry 50 is not particularly limited. For example, the slurry 50 may include a ceramic powder, an organic component for molding, and an organic solvent, or the like. Examples of the ceramic include alumina, talc, silica, calcium carbonate, or the like, for example. Examples of the organic component for molding include binder components such as polyvinyl butyral or the like, plasticizers such as dibutyl phthalate, or the like, for example.

A material forming the metal film 32 is not particularly limited. A melting point of the metal film 32 is preferably lower than a temperature at which a relative density of the green sheet 31 becomes 90% or higher by firing. A satisfactory sintered compact of the ceramic can be obtained when the relative density of the green sheet 31 is 90% or higher. When the melting point of the metal film 32 is lower than the temperature at which the relative density of the green sheet 31 becomes 90% or higher, the melting and solidifying of the metal film 32 occur during the process of obtaining the satisfactory sintered compact of the ceramic. For this reason, by restricting a range in which wetting of the melted metal spreads, it is possible to manufacture the ceramic member including the conductive material and having a desired shape.

The metal film 32 may be a film of aluminum or aluminum alloy, or a film of copper or copper alloy, for example. Examples of the aluminum alloy include Al—Cu alloys, Al—Zn—Mg alloys, Al—Zn—Mg—Cu alloys, Al—Si alloys, Al—Mg alloys, Al—Mg—Si alloys, Al—Mn alloys, or the like, for example. Examples of the copper alloy include Cu—Ni alloys, Cu—Zn alloys, Cu—Zn—Ni alloys, Cu—Mn—Ni alloys, Cu—Sn alloys, or the like, for example. When the aluminum alloy or the copper alloy is used for the metal film 32, the metal film 32 may be used for a resistive element, for example.

Second Embodiment

Figure 3A:
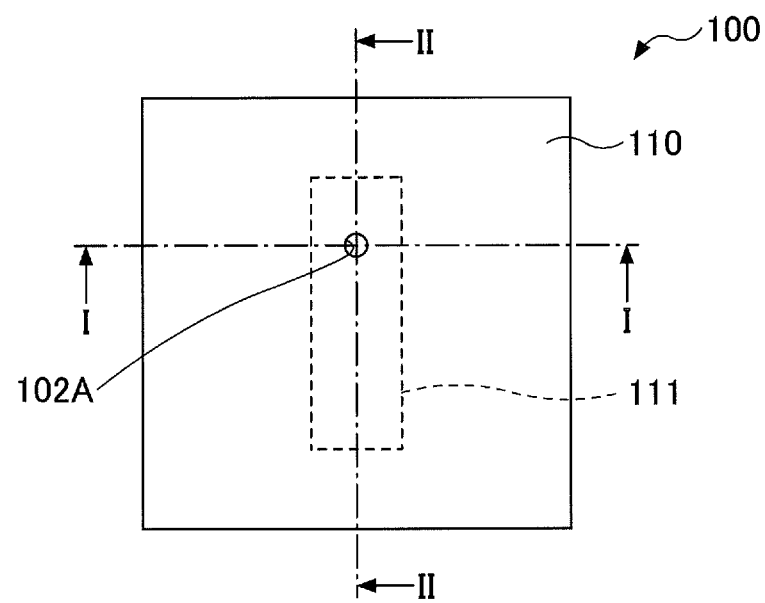
FIG. 3A, FIG. 3B, and FIG. 3C are diagrams illustrating a ceramic member according to a second embodiment.
Figure 3B:
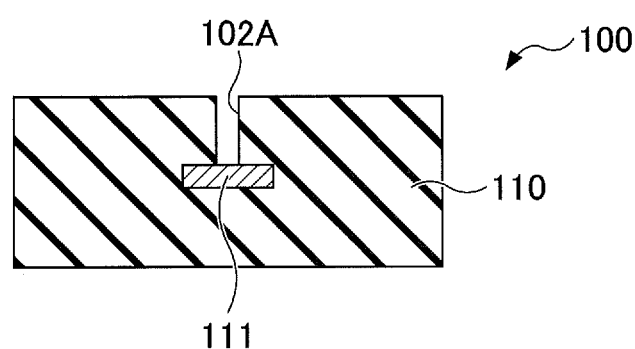
Figure 3C:
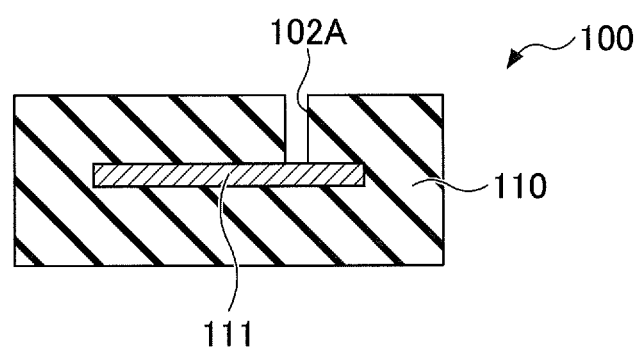

Next, a second embodiment will be described. The second embodiment relates to the ceramic member. FIG. 3A, FIG. 3B, and FIG. 3C are diagrams illustrating the ceramic member according to the second embodiment. FIG. 3A is a plan view of the ceramic member, FIG. 3B is a cross sectional view of the ceramic member along a line I-I in FIG. 3A, and FIG. 3C is a cross sectional view of the ceramic member along a line II-II in FIG. 3A.

As illustrated in FIG. 3A through FIG. 3C, a ceramic member 100 according to the second embodiment includes a ceramic sintered compact 110, and a conductive member 111 made of a bulk metal and provided within the sintered compact 110. Holes 102A that reach the conductive member 111 may be formed in the sintered compact 110. Examples of the bulk metal include aluminum, aluminum alloys, copper, copper alloys, or the like, for example.

In the ceramic member 100 having the above-mentioned structure, an electrical resistivity of the conductive member 111 can be made lower than an electrical resistivity of a conductive member that is formed using a paste of tungsten or molybdenum powder. In addition, a thermal conductivity of the conductive member 111 can be made higher than a thermal conductivity of the conductive member that is formed using the paste of the tungsten or molybdenum powder. For example, the electrical resistivity of tungsten is 52.8 nΩm, and the thermal conductivity of tungsten is 173 W/(mK). On the other hand, the electrical resistivity of aluminum is 28.2 nΩm, and the thermal conductivity of aluminum is 273 W/(mK). Further, the electrical resistivity of copper is 16.8 nΩm, and the thermal conductivity of copper is 401 W/(mK).

Moreover, according to a method which will be described later, the ceramic member 100 can be manufactured without performing long-term cleaning and long-term firing. In this case, it is possible to reduce an increase of the manufacturing cost of the ceramic member 100.

A relative density of the sintered compact 110 is preferably 90% or higher, and more preferably 95% or higher. When the relative density of the sintered compact 110 is lower than 90%, a probability of forming continuous pores becomes high, to easily generate penetration or evaporation loss of the material forming the conductive member 111.

The sintered compact 110 is preferably formed by a material that does not cause a chemical reaction with the material forming the conductive member 11 to progress. For example, when aluminum or aluminum alloy is used for the conductive member 111, the sintered compact 110 preferably includes 96 mass % or more of aluminum oxide ($Al_2O_3$), and more preferably 99 mass % or more of the aluminum oxide. Silicon oxide ($SiO_2$), magnesium oxide (MgO), and calcium oxide (CaO) chemically reacts to aluminum or aluminum alloy more easily than aluminum oxide. Accordingly, a total amount of the silicon oxide, the magnesium oxide, and the calcium oxide is preferably 4 mass % or less in the sintered compact 110, and more preferably 1 mass % or less in the sintered compact 110.

Copper or copper alloy is less likely to react to the ceramic when compared to aluminum or aluminum alloy. For this reason, when copper or copper alloy is used for the conductive member 111, the sintered compact 110 may include a larger amount of silicon oxide, magnesium oxide, and calcium oxide when compared to the case where aluminum or aluminum alloy is used for the conductive member 111.

Next, a method of manufacturing the ceramic member 100 according to the second embodiment will be described. FIG. 4A through FIG. 6B are plan views for explaining the method of manufacturing the ceramic member according to the second embodiment. FIG. 7A through FIG. 8C are cross sectional views for explaining the method of manufacturing the ceramic member according to the second embodiment. FIG. 7A through FIG. 8C correspond to cross sectional views along a line I-I in FIG. 4A through FIG. 6B, respectively.

Figure 4A:
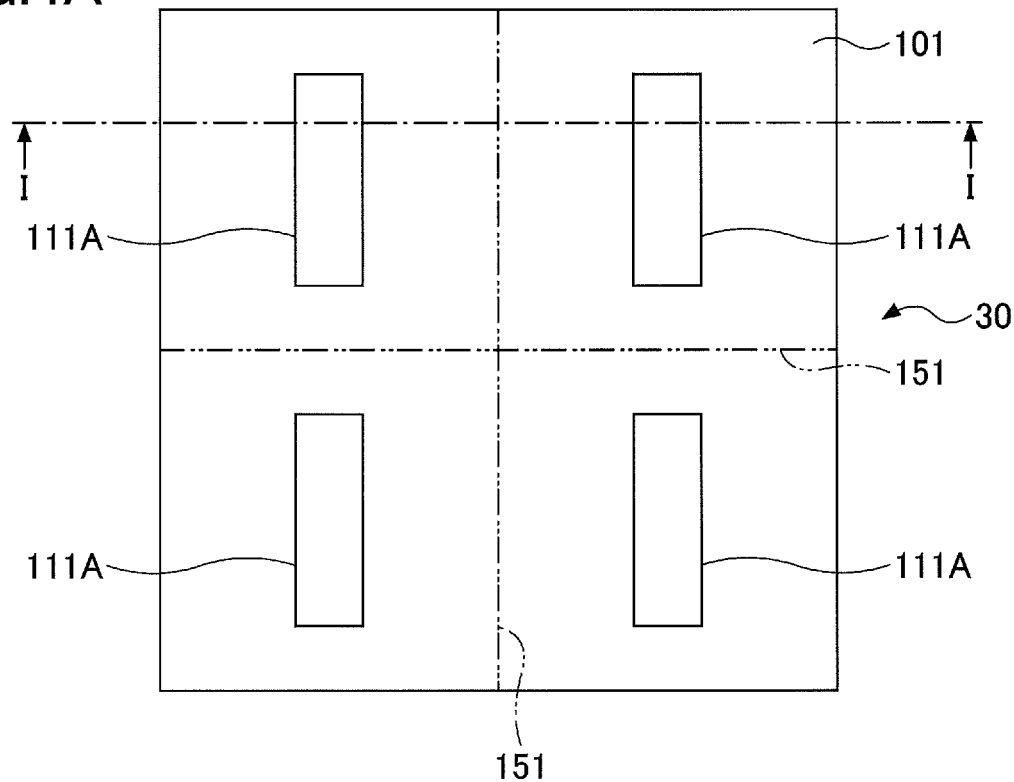
FIG. 4A and FIG. 4B are plan views for explaining a method of manufacturing the ceramic member according to the second embodiment.
Figure 7A:
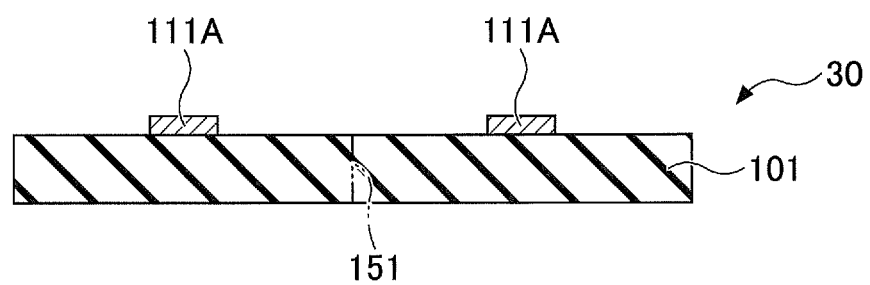
FIG. 7A, FIG. 7B, and FIG. 7C are cross sectional views for explaining the method of manufacturing the ceramic member according to the second embodiment.

First, the green sheet 30 according to the first embodiment is manufactured. For example, a film of aluminum or aluminum alloy is used as the metal film 32, and alumina is used as the ceramic of the slurry 50. Next, as illustrated in FIG. 4A and FIG. 7A, the composite green sheet 30 is punched into sizes and shapes such that four ceramic members 100 can be obtained, for example. In other words, the composite green sheet 30 after punching includes four regions where structures corresponding to the ceramic member 100 are formed. These regions are divided later by cutting along a cutting line 151. A second green sheet 102 and a third green sheet 103 which will be described later are obtained similar to the composite green sheet 30. Thereafter, a mask is formed on a region of the metal film 32 where the conductive member 111 is formed, and the metal film 32 is etched. Then, the mask is removed. By the series of processes described above, a first green sheet 101 is obtained from the green sheet 31, and a metal film 111A is obtained from the metal film 32.

Figure 4B:
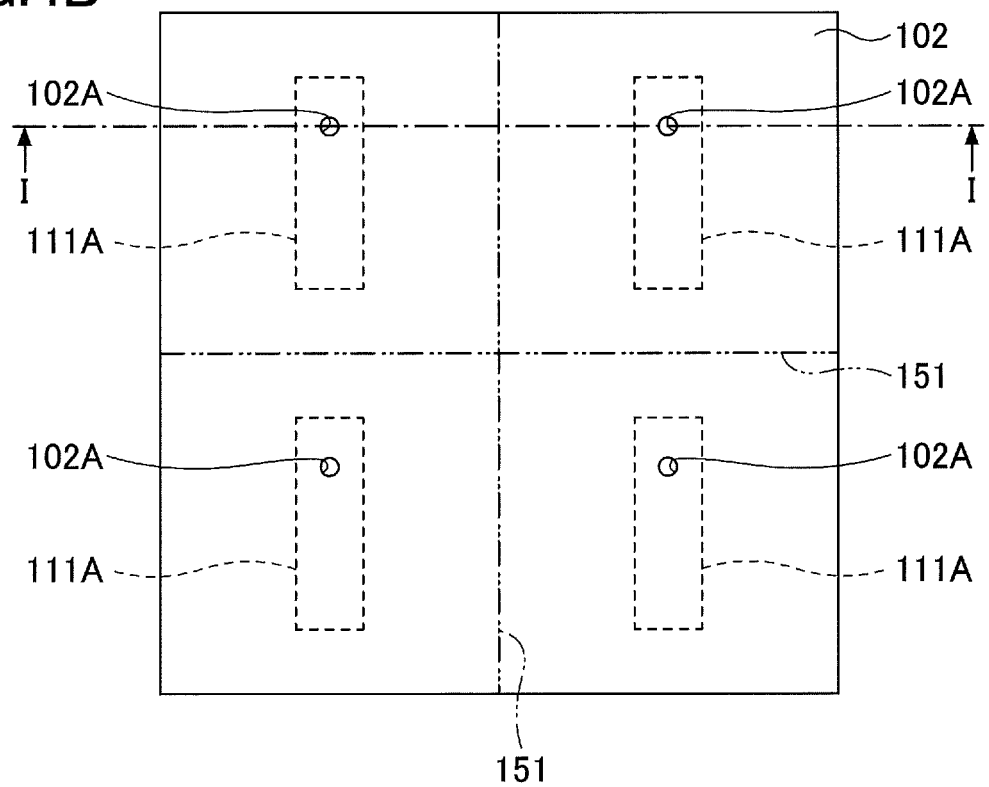
Figure 7B:
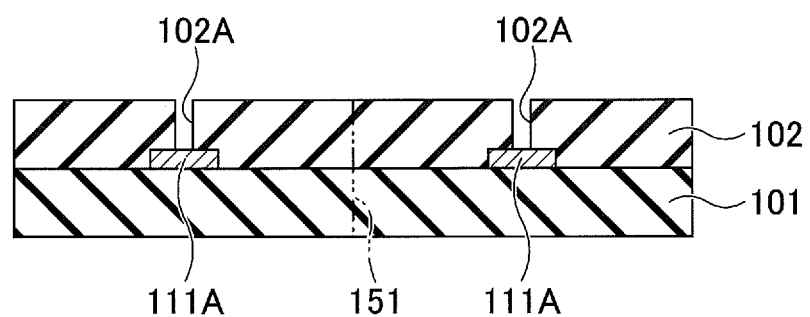

Thereafter, as illustrated in FIG. 4B and FIG. 7B, the second green sheet 102, formed with the holes 102A reaching the metal film 111A, is provided on the first green sheet 101.

Figure 5A:
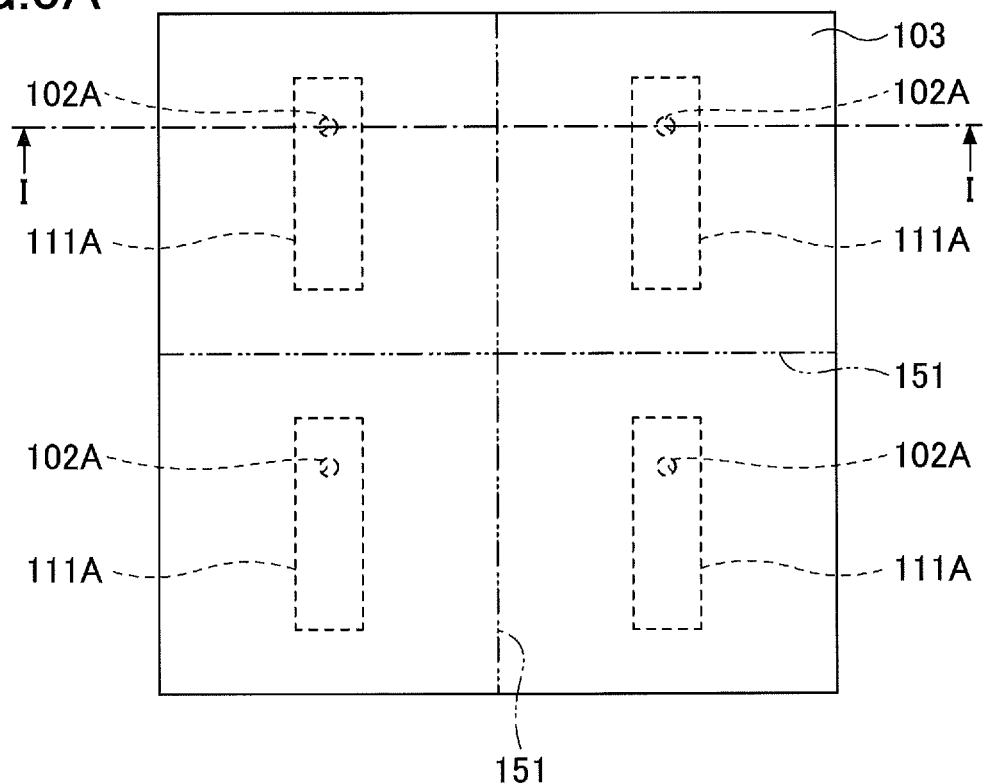
FIG. 5A and FIG. 5B are plan views for explaining the method of manufacturing the ceramic member according to the second embodiment.
Figure 7C:
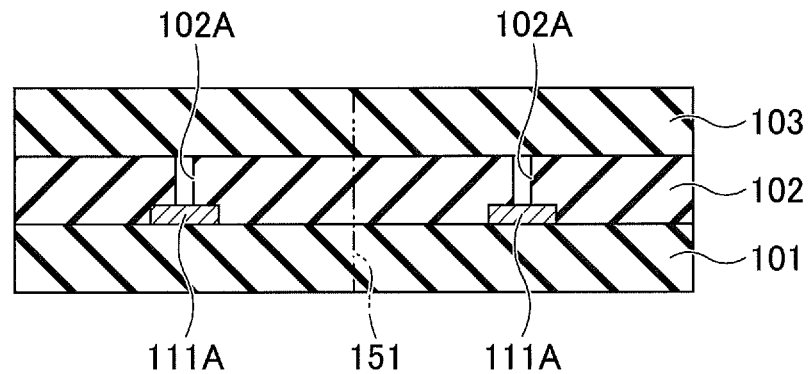

Next, as illustrated in FIG. 5A and FIG. 7C, the third green sheet 103 is provided on the second green sheet 102. The holes 102A of the second green sheet 102 are covered and blocked by the third green sheet 103. In this embodiment, a laminated structure that includes the second green sheet 102 and the third green sheet 103 forms an example of a second green sheet, and the holes 102A form an example of holes or bottomed holes (or cavities). The first green sheet of the composite green sheet is laminated on the second green sheet, so as to cover and block the holes or bottomed holes.

Figure 5B:
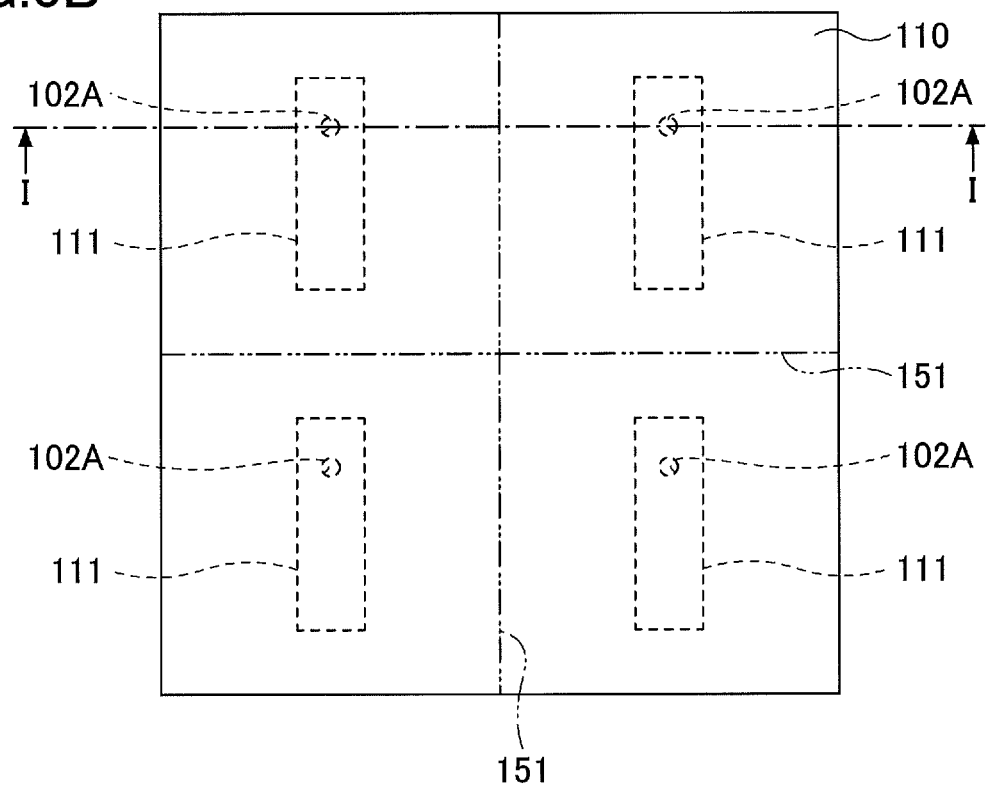
Figure 8A:
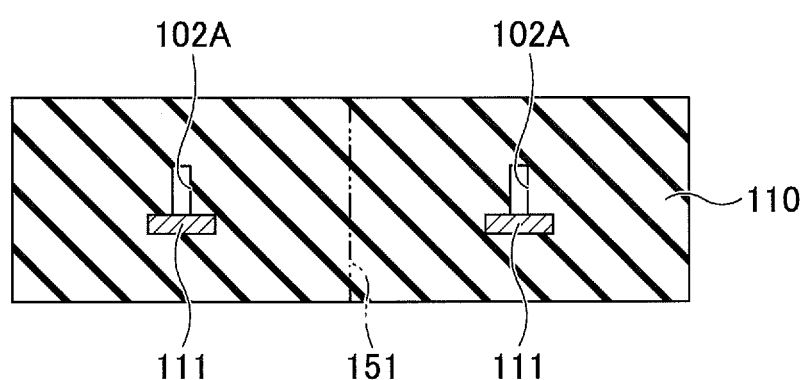
FIG. 8A, FIG. 8B, and FIG. 8C are cross sectional views for explaining the method of manufacturing the ceramic member according to the second embodiment.

Next, as illustrated in FIG. 5B and FIG. 8A, the first green sheet 101, the second green sheet 102, and the third green sheet 103 are integrated by heating and pressing. Thereafter, firing is performed to obtain the sintered compact 110. During the firing, the metal film 111A melts and solidifies, so that the conductive member 111 is obtained.

By performing the firing, densification of the first green sheet 101, the second green sheet 102, and the third green sheet 103 progresses approximately isotropically. As a result, a volume of the sintered compact 110 becomes smaller than a total volume of the first green sheet 101, the second green sheet 102, and the third green sheet 103. On the other hand, a volume of the conductive member 111 is approximately the same as a volume of the bulk metal film 111A. In this embodiment, the holes 102A are formed in the second green sheet 102, and shrinkage of the sintered compact 110 is completed while the metal film 111A melts. Hence, a part of the melted metal fills the holes 102A and solidifies. As a result, it is possible to avoid generation of an internal stress associated with the shrinkage of the sintered compact 110.

Figure 6A:
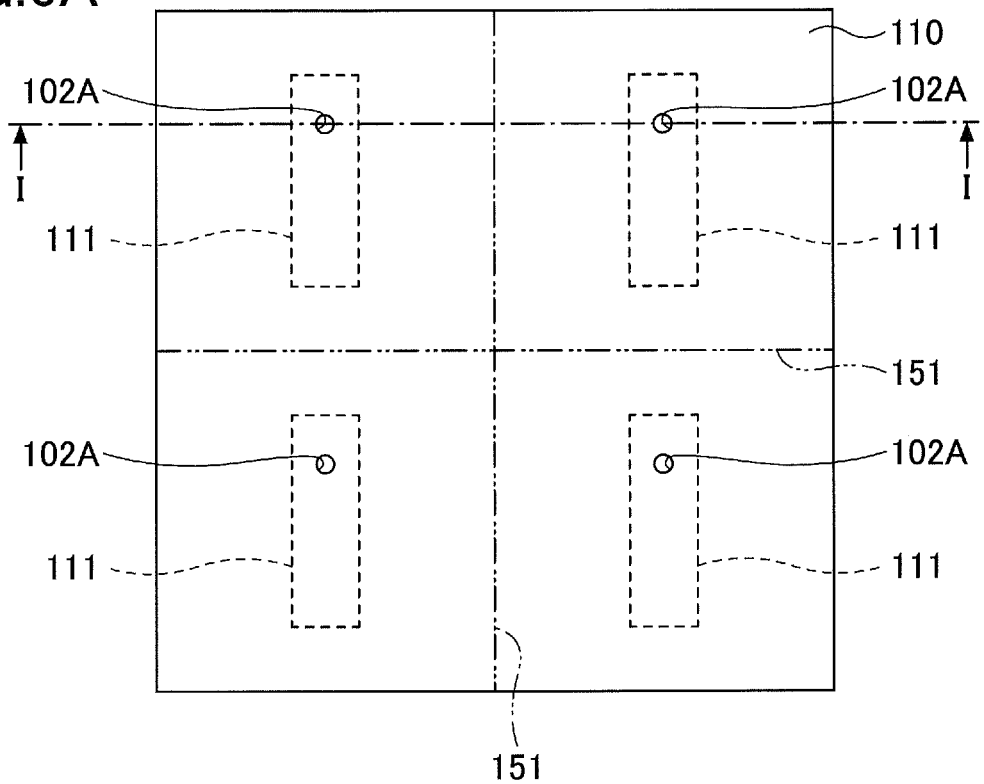
FIG. 6A and FIG. 6B are plan views for explaining the method of manufacturing the ceramic member according to the second embodiment.
Figure 8B:
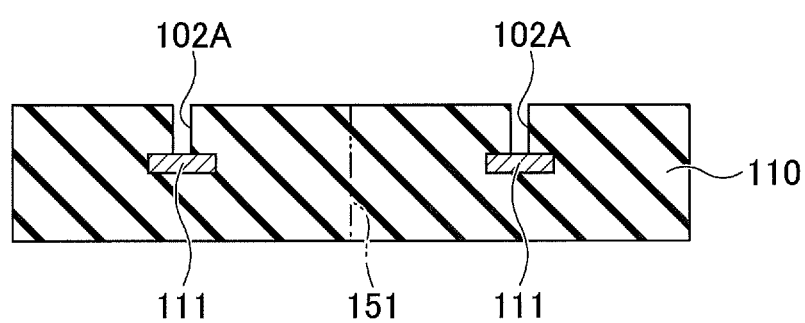

After the firing, grinding and polishing of the sintered compact 110 are performed, to expose the holes 102A, as illustrated in FIG. 6A and FIG. 8B.

Figure 6B:
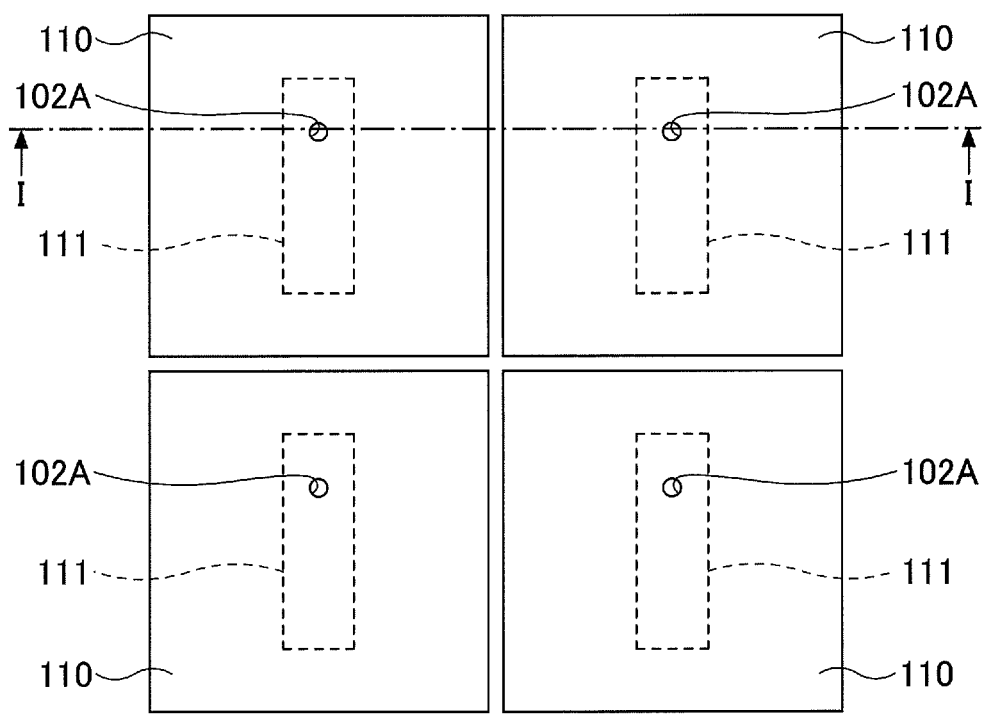
Figure 8C:
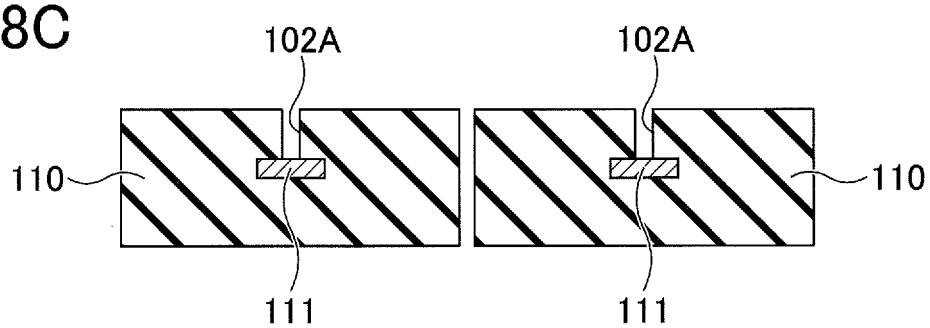

Next, as illustrated in FIG. 6B and FIG. 8C, the sintered compact 110 is cut along the cutting line 151, into individual pieces.

The ceramic member 100 according to the second embodiment can be manufactured by the processes described above.

According to this manufacturing method, when firing the first green sheet 101, the second green sheet 102, and the third green sheet 103 that are integrated, the conductive member 111 can be obtained from the metal film 111A. In other words, no special processes for obtaining the conductive member 111, such as the long-term cleaning and the long-term firing, are required. For this reason, it is possible to reduce an increase of the manufacturing cost of the ceramic member 100. In addition, because the holes 102A are formed in the second green sheet 102, it is possible to avoid the generation of the internal stress associated with the shrinkage of the sintered compact 110, that is, a volume shrinkage of the ceramic associated with the firing.

Furthermore, according to the conventional method that uses the paste of the metal powder, the mixing of the inclusion into the conductive member occurs, as described above. However, according to the manufacturing method described above, it is possible to use the bulk metal film 111A, and thus, the increase of the electrical resistivity and the reduction of the thermal conductivity, which would be respectively caused by the mixing of the inclusion, can be avoided.

When using the film of aluminum or aluminum alloy as the metal film 111A, a proportion of aluminum oxide in the ceramic forming the green sheet is preferably 96 mass % or higher, and more preferably 99 mass % or higher, for each of the first green sheet 101, the second green sheet 102, and the third green sheet 103. This proportion of aluminum oxide in the ceramic forming the green sheet is preferable from a viewpoint of reducing the chemical reaction between the ceramic and the aluminum or aluminum alloy.

Copper or copper alloy is less likely to react to the ceramic when compared to aluminum or aluminum alloy. For this reason, when using the film of copper or copper alloy as the metal film 32, the ceramic forming the green sheet may include larger amounts of silicon oxide, magnesium oxide, and calcium oxide, compared to the case where the film of aluminum or aluminum alloy is used as the metal film 32.

The sintering temperature for obtaining the sintered compact 110 is higher than or equal to a melting point of the metal film 111A, and is preferably 700° C. or higher. The sintering temperature is preferably 1300° C. or higher, although the sintering temperature depends on the material forming the first green sheet 101, the second green sheet 102, and the third green sheet 103. In addition, when the sintering temperature exceeds 1600° C., the chemical reaction easily occurs between the melted metal and the ceramic. For this reason, the sintering temperature is preferably 1600° C. or lower.

A sintering atmosphere for obtaining the sintered compact 110 is preferably an oxidizing atmosphere, such as air atmosphere or the like. A densification oxide film, which may be referred to as a passive film, is formed on the surface of the solidified aluminum or aluminum alloy. However, when the aluminum or aluminum alloy is heated to the melting point thereof or higher, the oxide film breaks down (or ruptures) depending on the melting of the aluminum or aluminum alloy, and in the air atmosphere or the reducing atmosphere, evaporation of the melted metal progresses according to a rise in the temperature. Particularly when the temperature is 1200° C. or higher, a rise in the vapor pressure is large, and the evaporation loss is large. On the other hand, in the oxidizing atmosphere, such as the air atmosphere or the like, a new oxide film is quickly formed even when the oxide film breaks down. For this reason, it is possible to reduce the evaporation loss of the aluminum or aluminum alloy.

In this embodiment, the breakdown and reformation of the oxide film may mainly occur at the part of the metal film 111A exposed to the holes 102A. An oxidation loss of the metal increases as a range of the breakdown and reformation of the oxide film increases. But according to this embodiment, the range of the breakdown and reformation of the oxide film is restricted, so that the oxidation loss of the aluminum or aluminum alloy is reduced.

By performing the sintering in the air atmosphere, it is possible to quickly remove the organic component included in the first green sheet 101, the second green sheet 102, and the third green sheet 103. By removing the organic component, it is possible to reduce undesirable effects of residual carbon on ceramic properties. In addition, the sintering in the air atmosphere does not require an atmosphere control gas, such as hydrogen, nitrogen, ammonia decomposition gas, or the like. Further, when compared to a vacuum atmosphere or the reducing atmosphere, the air atmosphere is more easily manageable, and is advantageous in that a low equipment cost and a low running cost can be achieved.

Of course, the number of ceramic members 100 obtained from the laminated structure of the first green sheet 101, the second green sheet 102, and the third green sheet 103 is not limited to four. For example, a single ceramic member 100 may be manufactured from the laminated structure of the first green sheet 101, the second green sheet 102, and the third green sheet 103.

In a final product of the ceramic member 100, the holes 102A do not need to be exposed, and a user of the ceramic member 100 may form a conduction path to the conductive member 111. A communication may be made using an electrostatic capacitance between the conductive member 111 and a conductive body arranged on an outer side of the ceramic member 100. In addition, the holes 102A may be filled with a conductive material, a ceramic material, or the like, for example.

Next, an experiment related to the second embodiment, conducted by the present inventors, will be described. FIG. 9A through FIG. 10B are plan views for explaining the method of manufacturing the ceramic member by the experiment related to the second embodiment. FIG. 11A through FIG. 12B are cross sectional views for explaining the method of manufacturing the ceramic member by the experiment related to the second embodiment. FIG. 11A through FIG. 12B correspond to cross sectional views along a line I-I in FIG. 9A through FIG. 10B.

Figure 9A:
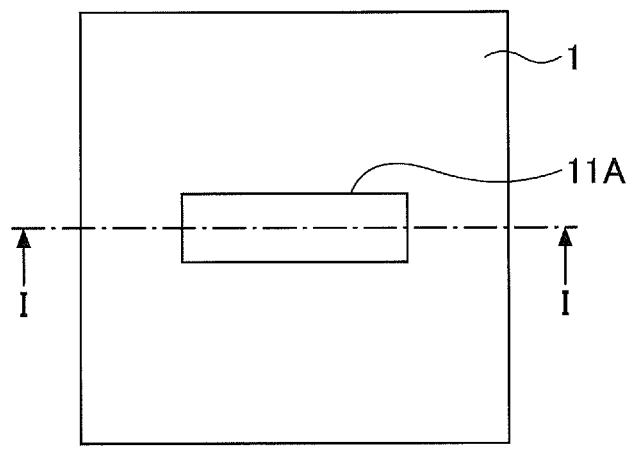
FIG. 9A and FIG. 9B are plan views for explaining the method of manufacturing the ceramic member by an experiment related to the second embodiment.
Figure 11A:
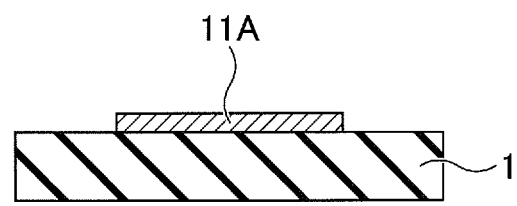
FIG. 11A, FIG. 11B, and FIG. 11C are cross sectional views for explaining the method of manufacturing the ceramic member by the experiment related to the second embodiment.

In this experiment, a composite green sheet having a first green sheet 1 and an aluminum film provided thereon, was manufactured according to the method of manufacturing the composite green sheet 30. A thickness of the aluminum film was approximately 12 µm. A slurry including an alumina powder having an average particle diameter of 1 µm or less, polyvinyl butyral, dibutyl phthalate, 2-propanol, and ethyl acetate that are mixed by a ball grinder (or ball mill), was used as a raw material slurry for the first green sheet 1. A thickness of the first green sheet 1 was approximately 0.5 mm. Next, a mask was formed on a part of the aluminum film, and the aluminum film was etched using an etchant that includes ferric chloride as a main component of the etchant. Then, the mask was removed. By the series of these processes, a rectangular aluminum film 11A having a planar size of 30 mm×10 mm remained on the first green sheet 1, as illustrated in FIG. 9A and FIG. 11A.

Figure 9B:
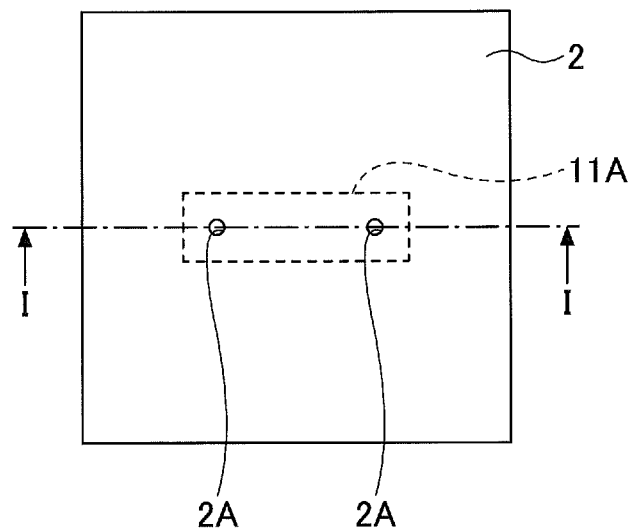
Figure 11B:
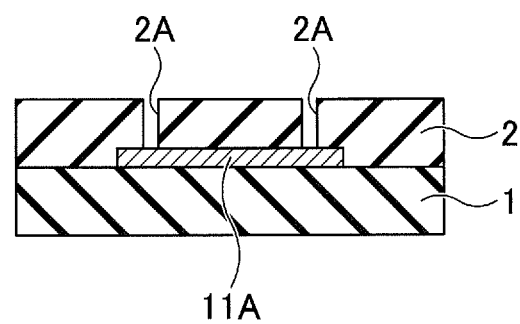

Thereafter, as illustrated in FIG. 9B and FIG. 11B, a second green sheet 2 having holes 2A, formed at two locations and reaching the aluminum film 11A, was provided on the first green sheet 1. The holes 2A had a diameter of 3 mm.

Figure 10A:
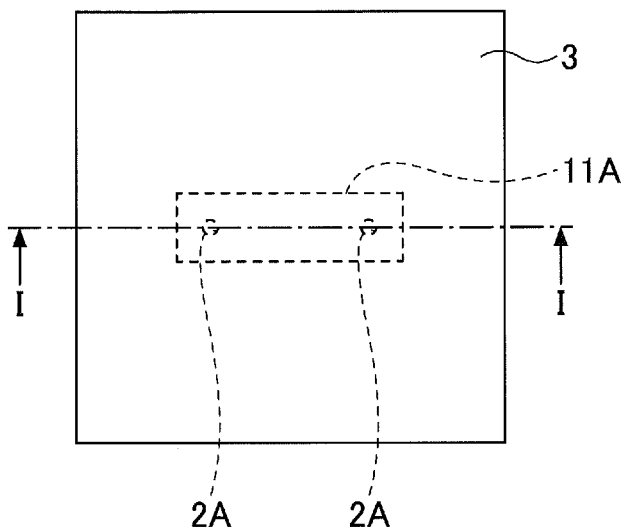
FIG. 10A and FIG. 10B are plan views for explaining the method of manufacturing the ceramic member by the experiment related to the second embodiment.
Figure 11C:
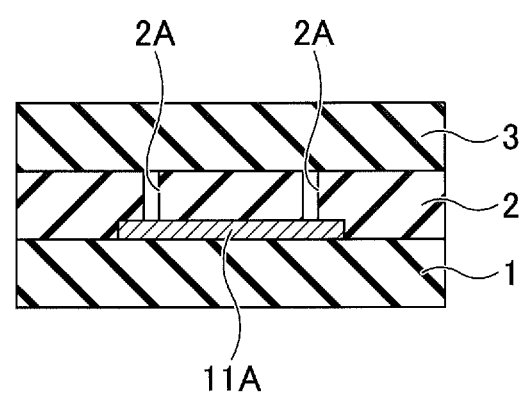

Then, as illustrated in FIG. 10A and FIG. 11C, a third green sheet 3 was provided on the second green sheet 2, to cover and block the holes 2A by the third green sheet 3.

Figure 12A:
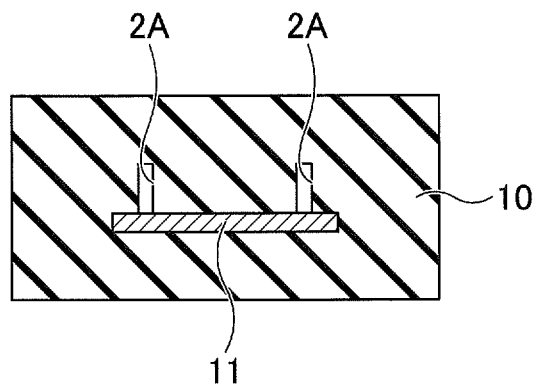
FIG. 12A and FIG. 12B are cross sectional views for explaining the method of manufacturing the ceramic member by the experiment related to the second embodiment.

Next, as illustrated in FIG. 12A, the first green sheet 1, the second green sheet 2, and the third green sheet 3 were integrated by heating and pressing. Thereafter, firing was performed at approximately 1500° C. in an air atmosphere, to obtain a sintered compact 10. The aluminum film 11A melted and solidified during the firing, and a conductive member 11 was obtained.

Figure 10B:
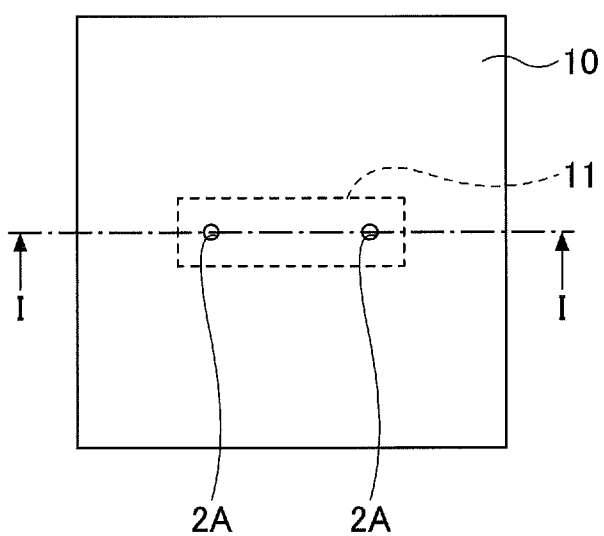
Figure 12B:
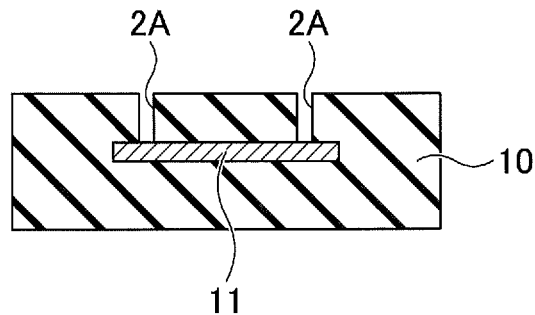

Then, as illustrated in FIG. 10B and FIG. 12B, grinding and polishing of the sintered compact 10 were performed, to expose the holes 2A.

A two-terminal type simple resistance tester, including contact resistance, was used to measure an electrical resistance of the conductive member 11. The measured resistance of the conductive member 11 was 0.3 mΩ and sufficiently low.

Components of the etchant for etching the aluminum film are not particularly limited, and various alkaline etchants, acid etchants, or the like may be used for the etchant to etch the aluminum film. For example, it is possible to use commercial aluminum etchant and chemical polishing liquid when etching the aluminum film. Components of the etchant for etching each of aluminum alloys, copper, and copper alloys are also not particularly limited.

Third Embodiment

Figure 13:
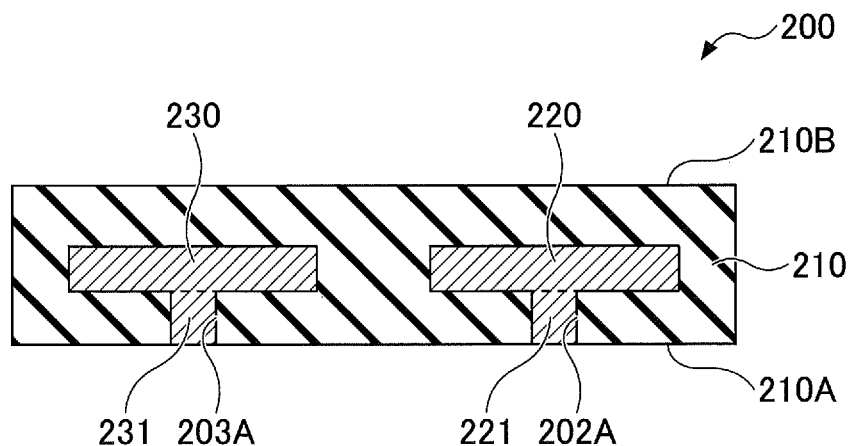
FIG. 13 is a cross sectional view illustrating an electrostatic chuck according to a third embodiment.

Next, a third embodiment will be described. The third embodiment relates to an electrostatic chuck that includes the ceramic member. FIG. 13 is a cross sectional view illustrating the electrostatic chuck according to the third embodiment.

As illustrated in FIG. 13, an electrostatic chuck 200 according to the third embodiment includes a ceramic sintered compact 210, an electrostatic electrode 220 made of a bulk metal and provided inside the sintered compact 210, and an electrostatic electrode 230 made of a bulk metal and provided inside the sintered compact 210. A hole 202A that reaches the electrostatic electrode 220, and a hole 203A that reaches the electrostatic electrode 230, are formed at one surface 210A of the sintered compact 210. A via conductor 221 that electrically connects to the electrostatic electrode 220 is provided inside the hole 202A. A via conductor 231 that electrically connects to the electrostatic electrode 230 is provided inside the hole 203A. The bulk metal used for the electrostatic electrodes 220 and 230 may be aluminum, aluminum alloy, copper, copper alloy, or the like, for example.

According to the electrostatic chuck 200 having the structure described above, a positive voltage is applied to one of the electrostatic electrodes 220 and 230 via the corresponding one of the via conductors 221 and 231, and a negative voltage is applied to the other of the electrostatic electrodes 220 and 230 via the corresponding other of the via conductors 221 and 231. As a result, a surface 210B of the sintered compact 210, on an opposite side from the surface 210A where the holes 202A and 203A are formed, is charged to attract an object such as a semiconductor wafer or the like on the surface 210B.

In the electrostatic chuck 200, an electrical resistivity of the electrostatic electrodes 220 and 230 can be made lower than an electrical resistivity of electrostatic electrodes that are formed using a paste of tungsten or molybdenum powder. In addition, a thermal conductivity of the electrostatic electrodes 220 and 230 can be made higher than a thermal conductivity of the electrostatic electrodes that are formed using the paste of tungsten or molybdenum powder. Furthermore, according to the electrostatic chuck 200, it is possible to reduce a thickness variation of the electrostatic electrodes 220 and 230.

Similar to the ceramic member 100, the electrostatic chuck 200 can be manufactured without performing long-term cleaning and long-term firing. In this case, it is possible to reduce an increase of the manufacturing cost of the electrostatic chuck 200.

A relative density of the sintered compact 210 is preferably 90% or higher, and more preferably 95% or higher. When the relative density of the sintered compact 210 is lower than 90%, a probability of forming continuous pores becomes high, to easily generate penetration or evaporation loss of the material forming the electrostatic electrodes 220 and 230.

The sintered compact 210 is preferably formed by a material that does not cause a chemical reaction with the material foisting the electrostatic electrodes 220 and 230 to progress. For example, when aluminum or aluminum alloy is used for the electrostatic electrodes 220 and 230, the sintered compact 210 preferably includes 96 mass % or more of aluminum oxide, and more preferably 99 mass % or more of the aluminum oxide.

When manufacturing the electrostatic chuck 200, processes up to grinding and polishing the sintered compact 210 to expose the holes 202A and 203A may be performed according to the method of manufacturing the ceramic member 100, for example. Thereafter, the via conductor 221 may be formed inside the hole 202A, and the via conductor 231 may be formed inside the hole 203A.

Depending on a size of the holes 202A and 203A, the metal that enters the holes 202A and 203A and solidifies due to volume shrinkage of the ceramic, may be used as the via conductors 221 and 231.

Fourth Embodiment

Figure 14:
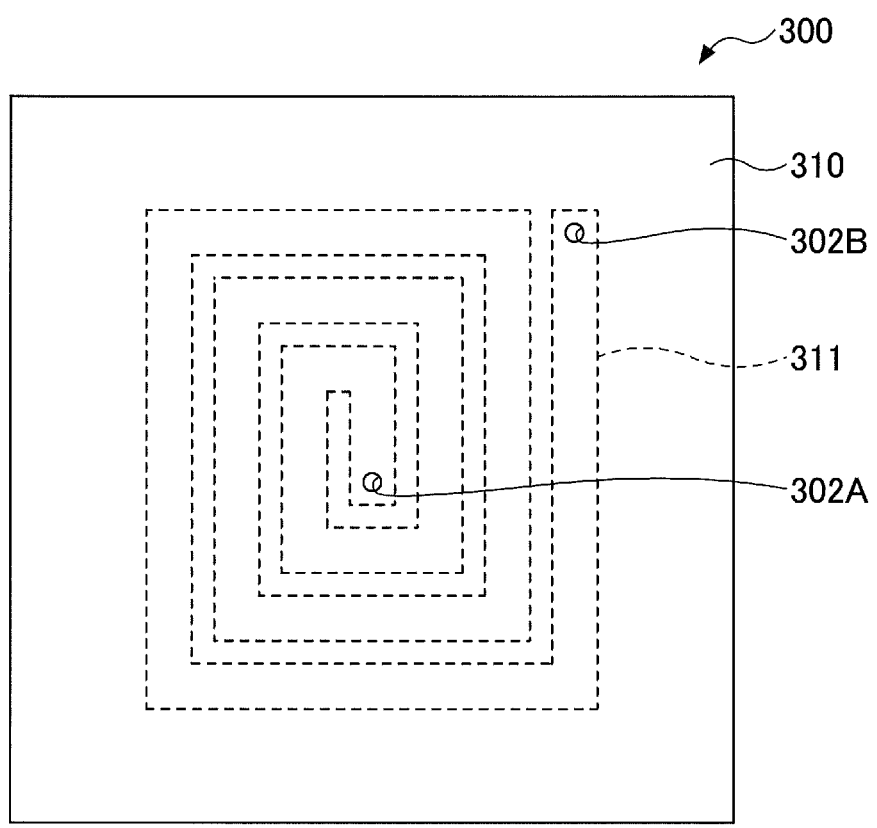
FIG. 14 is a plan view illustrating an inductor according to a fourth embodiment.

Next, a fourth embodiment will be described. The fourth embodiment relates to an inductor including the ceramic member. FIG. 14 is a plan view illustrating the inductor according to the fourth embodiment.

As illustrated in FIG. 14, an inductor 300 according to the fourth embodiment includes a ceramic sintered compact 310, and a conductive member 311 made of a bulk metal and provided inside the sintered compact 310. The conductive member 311 has a spiral planar shape. A hole 302A that reaches one end of the conductive member 311, and a hole 302B that reaches the other end of the conductive member 311, are formed at one surface of the sintered compact 310. The bulk metal used for the conductive member 311 may be aluminum, aluminum alloy, copper, copper alloy, or the like, for example.

The inductor 300 having the structure described above may be electrically connected to an external circuit (not illustrated) via the holes 302A and 302B.

In the inductor 300, an electrical resistivity of the conductive member 311 can be made lower than an electrical resistivity of a conductive member that is formed using a paste of tungsten or molybdenum powder. In addition, a thermal conductivity of the conductive member 311 can be made higher than a thermal conductivity of the conductive member that is formed using the paste of tungsten or molybdenum powder. Furthermore, according to the inductor 300, it is possible to reduce a thickness variation of the conductive member 311.

Similar to the ceramic member 100, the inductor 300 can be manufactured without performing long-term cleaning and long-term firing. In this case, it is possible to reduce an increase of the manufacturing cost of the inductor 300.

A relative density of the sintered compact 310 is preferably 90% or higher, and more preferably 95% or higher. When the relative density of the sintered compact 310 is lower than 90%, a probability of forming continuous pores becomes high, to easily generate penetration or evaporation loss of the material forming the conductive member 311.

The sintered compact 310 is preferably formed by a material that does not cause a chemical reaction with the material forming the conductive member 311 to progress. For example, when aluminum or aluminum alloy is used for the conductive member 311, the sintered compact 310 preferably includes 96 mass % or more of aluminum oxide, and more preferably 99 mass % or more of the aluminum oxide.

When manufacturing the inductor 300, processes up to grinding and polishing the sintered compact 310 to expose the holes 302A and 302B may be performed according to the method of manufacturing the ceramic member 100, for example.

Accordingly to each of the embodiments described above, it is possible to reduce the thickness variation of a conductive member.

Various aspects of the subject-matter described herein may be set out non-exhaustively in the following numbered clauses:

1. A method of manufacturing a composite green sheet, comprising:
    coating a ceramic slurry on a bulk metal film; and
    forming a green sheet by drying the slurry.
2. The method of manufacturing the composite green sheet according to clause 1, wherein the metal film has a melting point lower than a temperature at which a relative density of the green sheet becomes 90% or higher by firing.
3. The method of manufacturing the composite green sheet according to clause 1 or 2, wherein the metal film is made of a material selected from a group consisting of aluminum, aluminum alloys, copper, and copper alloys.
4. The method of manufacturing the composite green sheet according to any one of clauses 1 to 3, wherein the green sheet is made of a ceramic including 96 mass % or more aluminum oxide.

5. A method of manufacturing a ceramic member, comprising:
patterning a composite green sheet that includes a first green sheet, and a bulk metal film provided on the green sheet;
sandwiching the metal film between the first green sheet and a second green sheet; and
firing the first green sheet and the second green sheet at a temperature that is a melting point of the metal film or higher, to obtain a ceramic sintered compact,
wherein a plurality of holes or bottomed holes are formed at a part of a surface of the second green sheet contacting the metal film.

6. The method of manufacturing the ceramic member according to clause 5, wherein the firing is performed in an oxidizing air atmosphere.

7. The method of manufacturing the ceramic member according to clause 5, wherein the firing is performed in air atmosphere.

8. The method of manufacturing the ceramic member according to any one of clauses 5 to 7, wherein the metal film has a melting point lower than a temperature at which a relative density of the green sheet becomes 90% or higher by firing.

9. The method of manufacturing the ceramic member according to any one of clauses 5 or 8, wherein the metal film is made of a material selected from a group consisting of aluminum, aluminum alloys, copper, and copper alloys.

10. The method of manufacturing the ceramic member according to any one of clauses 5 to 9, wherein the green sheet is made of a ceramic including 96 mass % or more aluminum oxide.

Although the embodiments are numbered with, for example, "first," "second," "third," or "fourth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, although the ceramic member is applied to the electrostatic chuck in the third embodiment, and the ceramic member is applied to the inductor in the fourth embodiment, the application of the ceramic member is not limited to such applications or usages. For example, the ceramic member may be used in a mounting board for power semiconductor devices or the like.

What is claimed is:

1. A composite green sheet comprising:
an unfired green sheet made of a ceramic powder; and
an unfired bulk metal film, formed of a metal selected from a group consisting of aluminum, aluminum alloys, copper, and copper alloys, and having a first surface in contact with the green sheet made of ceramic powder, and a second surface on an opposite side of the first surface and exposed to an outside,
wherein the bulk metal film has a melting point $T1$, and the green sheet made of ceramic powder exhibits a relative density of approximately 90% or higher after firing at a firing temperature $T2$ higher than or equal to the melting point $T1$, such that the composite green sheet exhibits:
a decrease in a volume of the green sheet made of ceramic powder when fired at the firing temperature $T2$ that depends on the metal forming the bulk metal film and falls within a range higher than or equal to 700° C. and lower than or equal to 1600° C.,
substantially no change in a volume of the bulk metal film when fired at the firing temperature $T2$, and
melting and solidifying of the bulk metal film when fired at the firing temperature $T2$.

2. The composite green sheet as claimed in claim 1, wherein the bulk metal film is made of aluminum or an aluminum alloy.

3. The composite green sheet as claimed in claim 2, wherein the aluminum alloy is selected from a group consisting of Al—Cu alloys, Al—Zn—Mg alloys, Al—Zn—Mg—Cu alloys, Al—Si alloys, Al—Mg alloys, Al—Mg—Si alloys, and Al—Mn alloys.

4. The composite green sheet as claimed in claim 2, wherein the firing temperature $T2$ depends on the aluminum or the aluminum alloy forming the bulk metal film and falls within a range higher than or equal to 700° C. and lower than or equal to 1600° C.

5. The composite green sheet as claimed in claim 1, wherein the bulk metal film is made of copper or a copper alloy.

6. The composite green sheet as claimed in claim 5, wherein the copper alloy is selected from a group consisting of Cu—Ni alloys, Cu—Zn alloys, Cu—Zn—Ni alloys, Cu—Mn—Ni alloys, and Cu—Sn alloys.

7. The composite green sheet as claimed in claim 5, wherein the firing temperature $T2$ depends on the copper or the copper alloy forming the bulk metal film and falls within a range higher than or equal to 1100° C. and lower than or equal to 1600° C.

8. The composite green sheet as claimed in claim 1, wherein the ceramic powder includes 96 mass % or more aluminum oxide.

9. The composite green sheet as claimed in claim 1, which further exhibits:
no chemical reaction of the green sheet made of ceramic powder with the metal forming the bulk metal film progressing when fired at the firing temperature $T2$.

10. The composite green sheet as claimed in claim 1, which further exhibits:
flexibility of the green sheet made of ceramic powder before firing at the firing temperature $T2$.

11. The composite green sheet as claimed in claim 1, wherein the bulk metal film has a uniform thickness.

12. The composite green sheet as claimed in claim 1, which further exhibits:
substantially no inclusion of the bulk metal film when the melting and solidifying of the bulk metal film are exhibited.

13. The composite green sheet as claimed in claim 1, wherein the firing temperature $T2$ depends on the metal forming the bulk metal film and falls within a range higher than or equal to 1300° C. and lower than or equal to 1600° C.

14. A ceramic member comprising:
an unfired first green sheet made of a ceramic powder; and
an unfired bulk metal film, formed of a metal selected from a group consisting of aluminum, aluminum alloys, copper, and copper alloys, and having a first surface in contact with the first green sheet, and a second surface on an opposite side of the first surface; and
an unfired second green sheet made of a ceramic powder, provided on the first green sheet, covering the bulk metal film, and including a hole exposing the second surface of the bulk metal film,
wherein the bulk metal film has a melting point T1, and each of the first green sheet and the second green sheet exhibits a relative density of approximately 90% or higher after firing at a firing temperature T2 higher than or equal to the melting point T1, such that a combination of the first green sheet, the second green sheet, and the bulk metal film exhibits:
a decrease in a volume of each of the first green sheet and the second green sheet when fired at the firing temperature T2 that depends on the metal forming the bulk metal film and falls within a range higher than or equal to 700° C. and lower than or equal to 1600° C.,
substantially no change in a volume of the metal film when fired at the firing temperature T2, and
melting and solidifying of the bulk metal film when fired at the firing temperature T2.

15. The ceramic member as claimed in claim 14, further comprising:
an unfired third green sheet made of a ceramic powder, provided on the second green sheet, and covering the hole,
wherein the melting point T1 of the bulk metal film is lower than the firing temperature T2 at which a relative density of each of the first green sheet, the second green sheet, and the third green sheet becomes approximately 90% or higher by firing, such that a combination of the first green sheet, the second green sheet, the third green sheet, and the bulk metal film exhibits:
a decrease in a volume of each of the first green sheet, the second green sheet, and the third green sheet when fired at the firing temperature T2.

16. The ceramic member as claimed in claim 14, wherein the combination of the first green sheet, the second green sheet, and the bulk metal film further exhibits:
substantially no inclusion of the bulk metal film when the melting and solidifying of the bulk metal film are exhibited.

17. The ceramic member as claimed in claim 14, wherein the firing temperature T2 depends on the metal forming the bulk metal film and falls within a range higher than or equal to 1300° C. and lower than or equal to 1600° C.

18. The ceramic member as claimed in claim 14, wherein the firing temperature T2 depends on the metal forming the bulk metal film and falls within
a range higher than or equal to 700° C. and lower than or equal to 1600° C. in a case where the bulk metal film is made of aluminum or an aluminum alloy, or
a range higher than or equal to 1100° C. and lower than or equal to 1600° C. in a case where the bulk metal film is made of copper or a copper alloy.

19. A composite green sheet comprising:
an unfired green sheet made of a ceramic powder including 96 mass % or more aluminum oxide; and
an unfired metal film, formed of a metal selected from a group consisting of aluminum, aluminum alloys, copper, and copper alloys, and having a first surface in contact with the green sheet made of ceramic powder, and a second surface on an opposite side from the first surface and exposed to an outside,
wherein the metal film has a melting point, and the green sheet made of ceramic powder exhibits a relative density of approximately 90% or higher after firing at a firing temperature higher than or equal to the melting point, such that the composite green sheet exhibits:
a decrease in a volume of the green sheet when fired at the firing temperature that depends on the metal forming the metal film and falls within a range higher than or equal to 700° C. and lower than or equal to 1600° C.,
substantially no change in a volume of the metal film when fired at the firing temperature,
melting and solidifying of the metal film when fired at the firing temperature,
no chemical reaction of the green sheet made of ceramic powder with the metal forming the metal film progressing when fired at the firing temperature, and
substantially no inclusion of the metal film when the melting and solidifying of the metal film are exhibited.

* * * * *